United States Patent
Joung et al.

(10) Patent No.: US 9,148,152 B1
(45) Date of Patent: Sep. 29, 2015

(54) DEVICE FOR MAINTAINING SYNCHRONIZATION OF PLURALITY OF FIELD PROGRAMMABLE GATE ARRAYS (FPGAS)

(71) Applicant: INNOWIRELESS CO., LTD., Gyeonggi-do (KR)

(72) Inventors: Jin-Soup Joung, Gyeonggi-do (KR); Joo-Hyeong Lee, Seoul (KR); Young-Jin Kang, Gyeonggi-do (KR)

(73) Assignee: INNOWIRELESS CO., LTD. (KR)

( * ) Notice: Subject to any disclaimer, the term of this patent is extended or adjusted under 35 U.S.C. 154(b) by 0 days.

(21) Appl. No.: 14/286,192

(22) Filed: May 23, 2014

(30) Foreign Application Priority Data

May 16, 2014 (KR) ........................ 10-2014-0059175

(51) Int. Cl.
G06F 7/38 (2006.01)
H03K 19/177 (2006.01)
H03K 19/096 (2006.01)
H03K 5/135 (2006.01)
G06F 1/10 (2006.01)
G06F 1/08 (2006.01)

(52) U.S. Cl.
CPC .............. *H03K 19/1774* (2013.01); *G06F 1/08* (2013.01); *G06F 1/10* (2013.01); *H03K 5/135* (2013.01); *H03K 19/0963* (2013.01); *H03K 19/1776* (2013.01)

(58) Field of Classification Search
None
See application file for complete search history.

(56) References Cited

U.S. PATENT DOCUMENTS

| | | | | |
|---|---|---|---|---|
| 6,008,680 A | * | 12/1999 | Kyles et al. | 327/277 |
| 6,856,171 B1 | * | 2/2005 | Zhang | 326/93 |
| 7,028,281 B1 | * | 4/2006 | Agrawal et al. | 326/41 |
| 7,109,754 B1 | * | 9/2006 | Zhang | 326/46 |
| 7,109,756 B1 | * | 9/2006 | Zhang | 326/93 |
| 7,181,662 B2 | * | 2/2007 | Chien | 714/724 |
| 7,499,519 B1 | * | 3/2009 | Hsieh et al. | 377/64 |
| 8,732,509 B2 | * | 5/2014 | Kwak | 713/401 |
| 8,963,581 B1 | * | 2/2015 | Lewis et al. | 326/40 |
| 9,047,152 B2 | * | 6/2015 | Chu | 1/1 |

* cited by examiner

*Primary Examiner* — Vibol Tan
(74) *Attorney, Agent, or Firm* — Kaplan Breyer Schwarz & Ottesen, LLP

(57) ABSTRACT

A device for maintaining synchronization of a plurality of FPGAs which can easily and precisely maintain the synchronization of the plurality of FPGAs in a device in which two or more FPGAs are interactively connected and operated is provided. The device is included in each of the plurality of FPGAs, and includes a trigger signal generator configured to generate an internal trigger signal itself; a trigger multiplexer configured to select one of the internal trigger signal generated by the trigger signal generator and a trigger signal input from the outside; a delay signal generator including a plurality of stages of flip-flops, each of the plurality of stages of flip-flops configured to delay the trigger signal by one clock cycle; and a synchronization multiplexer configured to select and output one of output signals of the plurality of stages of flip-flops of the delay signal generator.

4 Claims, 2 Drawing Sheets

DEVICE FOR MAINTAINING SYNCHRONIZATION OF PLURALITY OF FIELD PROGRAMMABLE GATE ARRAYS (FPGAS)

CROSS-REFERENCE TO RELATED APPLICATION

This application claims priority to and the benefit of Korean Patent Application No. 10-2014-0059175, filed on May 16, 2014, the disclosure of which is incorporated by reference herein in its entirety.

BACKGROUND

1. Field of the Invention

The present invention relates to a device for maintaining synchronization of a plurality of field programmable gate arrays (FPGAs), and more particularly, to a device for maintaining synchronization of a plurality of FPGAs which can easily and precisely maintain the synchronization of the plurality of FPGAs in a device in which two or more FPGAs are interactively connected and operated.

2. Discussion of Related Art

As well known, a field programmable gate array (FPGA) is a semiconductor device including a programmable logic element and an internal line, and a user can implement a desired device by programming a FPGA chip in a state in which the FPGA chip is installed on a board. The FPGA configures a combinational logic using a look-up table (LUT) instead of simple gates such as an AND gate, a NAND gate, an OR gate, and a NOR gate, and can implement a sequential logic since flip-flops are connected in the output stage of the LUT.

In addition to the LUT, the FPGA further includes an adder/multiplier for calculation, a phase locked loop (PLL) block for providing clocks with various forms in the FPGA, a high-speed serial input/output such as a peripheral component interconnect-Express (PCI-Express) or a serial advanced technology attachment (SATA), a central processing unit (CPU) for processing complex calculations, a memory such as a static random access memory (SRAM) or a dynamic random access memory (DRAM), an Ethernet media access control (MAC), etc. The FPGA has been applied in various fields such as a digital unit (DU) for processing a digital signal or a radio unit (RU) for processing a radio signal, etc, of a digital signal processor (DSP), an initial version of an application specific integrated circuit (ASIC), a computer hardware emulator, a baseband emulator, or a centralized/cloud radio access network (CRAN).

Meanwhile, when implementing a device requiring a large amount of logic using the FPGA, for example, the DU or the RU of the CRAN, it may not be sufficient to implement the device using only one FPGA, and in this case, the device may be implemented using a plurality of FPGAs. Accordingly, when constituting the device using two or more FPGAs, the device may be interactively and easily operated only when precisely maintaining synchronization of all FPGAs.

In the device including the two or more FPGAs, a conventional method for maintaining the synchronization of the FPGAs may simultaneously provide a trigger signal by a trigger signal generator for all FPGAs and independently match the synchronization in each of the FPGAs in a state in which the trigger signal generator is separately provided from the device. However, this method has a problem in which costs of the device are increased and also a size of the device is increased since the trigger signal generator is separately provided.

On the other hand, there is a method of adding synchronization information in a header and transmitting the header to a data line. In this case, there is a problem in which data throughput is lowered due to the addition of the synchronization information in the header.

SUMMARY OF THE INVENTION

The present invention is directed to a device for maintaining synchronization of a plurality of field programmable gate arrays (FPGAs) capable of easily and precisely maintaining the synchronization of the plurality of FPGAs in a device in which two or more FPGAs are interactively connected and operated.

According to an aspect of the present invention, there is provided a device for maintaining synchronization of a plurality of FPGAs included in each of the plurality of FPGAs, including: a trigger signal generator configured to generate an internal trigger signal itself; a trigger multiplexer configured to select one of the internal trigger signal generated by the trigger signal generator and a trigger signal input from the outside; a delay signal generator including a plurality of stages of flip-flops, each of the plurality of stages of flip-flops configured to delay the trigger signal by one clock cycle; and a synchronization multiplexer configured to select and output one of output signals of the plurality of stages of flip-flops of the delay signal generator.

The device may further include a flip-flop configured to prevent a meta-stable state of the external trigger signal and connected to a previous stage of the trigger multiplexer.

The flip-flop may be a D flip-flop.

The device may further include a control unit configured to control the trigger multiplexer and the synchronization multiplexer, and control a pulse width and a period of the internal trigger signal output from the trigger signal generator.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
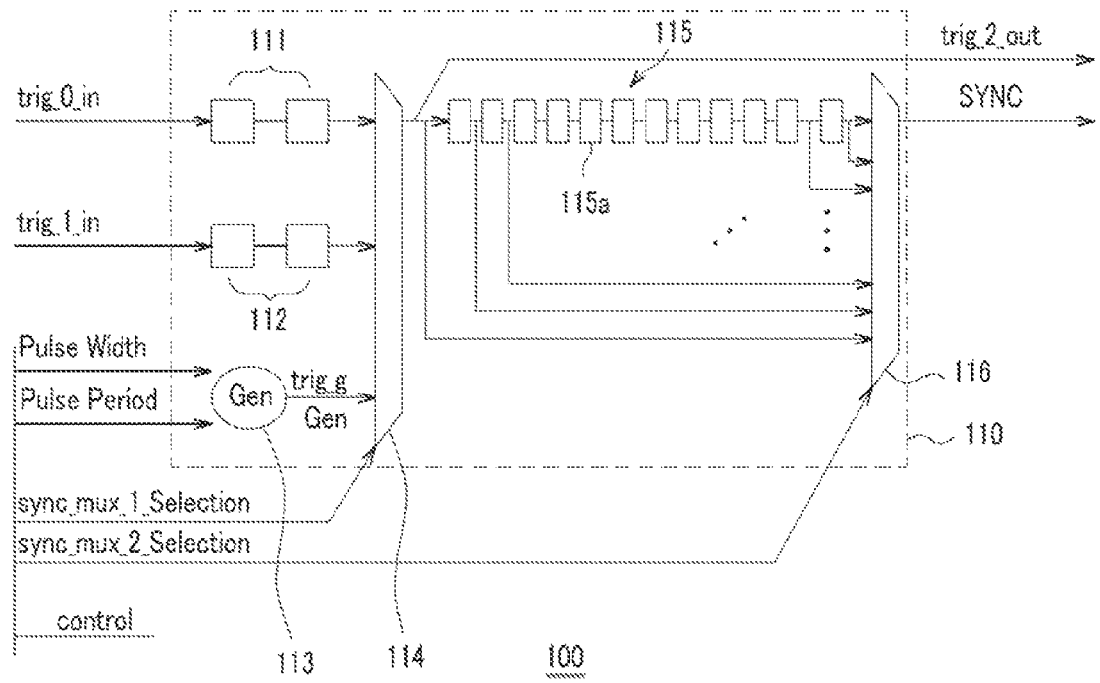
FIG. 1 is a diagram illustrating an inner construction of a device for maintaining synchronization of a plurality of field programmable gate arrays (FPGAs) according to an exemplary embodiment of the present invention.

FIG. 1 is a diagram illustrating an inner construction of a device for maintaining synchronization of a plurality of field programmable gate arrays (FPGAs) according to an exemplary embodiment of the present invention. For convenience, the device including two FPGAs will be described as an example. As shown in FIG. 1, a device 110 for maintaining synchronization of a plurality of FPGAs may be included in each FPGA 100, and may include a trigger multiplexer 114 for selecting one of a plurality of external input trigger signals trig_0_in and trig_1_in and an internal generation trigger signal trig_g, a delay signal generator 115 including a plurality of stages of flip-flops 115a having a feature in which each flip-flop delays a trigger signal by one clock cycle, and a synchronization multiplexer 116 for selecting one of the output signals of the plurality of stages of flip-flops 115a of the delay signal generator 115 and outputting the selected output signal as a synchronization signal SYNC.

In the construction described above, when there is an external trigger signal generator (not shown), the external input trigger signals trig_0_in and trig_1_in may be trigger signals provided from the external trigger signal generator or trigger signals provided from another FPGA. The external input trigger signals trig_0_in and trig_1_in may have a period different from each other, and be a plurality of trigger signals.

Meanwhile, the device 110 for maintaining synchronization according to the present invention may further include a trigger signal generator 113 for generating a trigger signal itself inside the FPGA 100 compared to a conventional art that there is no external trigger signal generator. For example, a pulse width and a period of the internal generation trigger signal trig_g generated by the trigger signal generator 113 may be arbitrarily set by, for example, an external control personal computer (PC) (not shown).

In FIG. 1, when blocks indicated by reference numerals 111 and 112 which are not described above receive the external input trigger signals trig_0_in and trig_1_in, respectively, the blocks 111 and 112 may be flip-flops inserted for preventing a meta-stable state which is a malfunction state occurring due to noncompliance of a set-up time and a hold time according to a well-known timing specification. In an exemplary embodiment, a two-stage flip-flop, for example, a two-stage D flip-flop may be constituted with respect to each of the external input trigger signals trig_0_in and trig_1_in.

Next, the delay signal generator 115 may be configured as the plurality of stages of flip-flops 115a, for example, a plurality of stages of D flip-flops, each flip-flop 115a may delay an output signal of a previous stage flip-flop by one cycle and output the delayed output signal, and the synchronization multiplexer 116 may select a desired one of output signals of the plurality of flip-flops 115a and output the selected one output signal as the synchronization signal SYNC.

Meanwhile, the output signal of the trigger multiplexer 114 or the synchronization multiplexer 116 may be selected by a control signal CON output from the external control PC, etc.

Figure 2:
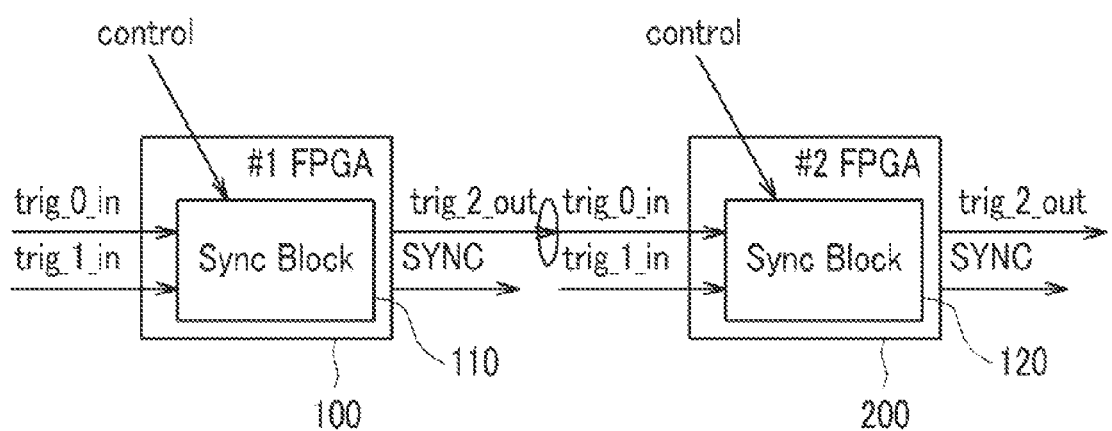
FIG. 2 is a diagram illustrating connection of a device for maintaining synchronization of a plurality of FPGAs according to an exemplary embodiment of the present invention.

FIG. 2 is a diagram illustrating connection of a device for maintaining synchronization of a plurality of FPGAs according to an exemplary embodiment of the present invention. FIG. 2 illustrates an example of constituting a single device by interactively connecting two FPGAs 100 and 200. As shown in FIG. 2, a device 110 for maintaining synchronization of a previous stage FPGA 100 operating as a master may select one of the plurality of external input trigger signals trig_0_in and trig_1_in, and the internal generation trigger signal trig_g as a trigger signal by the external control signal CON.

The selected trigger signal may be output through a trigger output terminal trig_0_out, and a next stage FPGA 200 operating as a slave may generate a synchronization signal SYNC for sub-modules embedded using an output trigger signal trig_0_out output from the master FPGA 100 as the external input trigger signal trig_0_in.

Figure 3:
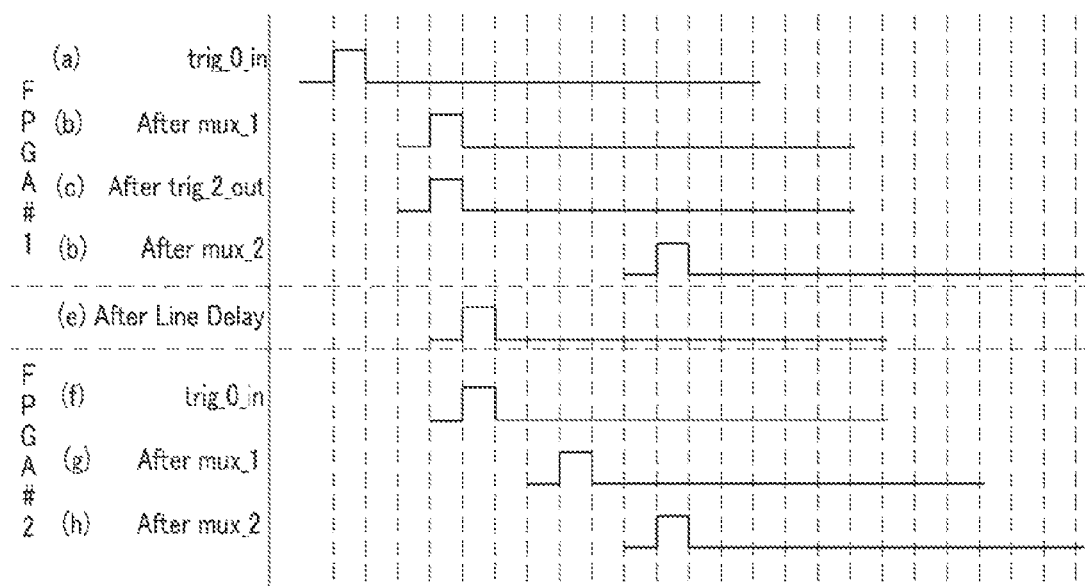
FIG. 3 is a timing diagram illustrating an operation of a device for maintaining synchronization of a plurality of FPGAs according to an exemplary embodiment of the present invention.

FIG. 3 is a timing diagram illustrating an operation of a device for maintaining synchronization of a plurality of FPGAs according to an exemplary embodiment of the present invention. FIG. 3 is a timing diagram of an example that two FPGAs 100 and 200 are connected. As described above, the master FPGA 100 may select one of two external input trigger signals trig_0_in and trig_1_in, and the internal generation trigger signal trig_g as the trigger signal by the trigger multiplexer 114. In FIG. 3, an example in which the first external input trigger signal trig_0_in is selected (refer to (a) of FIG. 3) is illustrated. It will be described with reference to FIG. 3.

Here, since the first external input trigger signal trig_0_in passes through the two-stage flip-flop 111 for preventing the meta-stable state, the first external input trigger signal trig_0_in may be delayed by two clock cycles, and since the first external input trigger signal trig_0_in further passes through the trigger multiplexer 114, the first external input trigger signal trig_0_in may be further delayed by one clock cycle. Accordingly, the first external input trigger signal trig_0_in may be a signal which is totally delayed by three clock cycles (refer to (b) of FIG. 3). The delayed signal may be bypassed through a trigger output terminal trig_2_out of the master FPGA 100 in order to be used as the first external input trigger signal trig_0_in of the slave FPGA 200 (refer to (c) of FIG. 3).

Meanwhile, suppose that a signal delayed by a total of 7 clock cycles is selected as a synchronization signal SYNC inside the master FPGA 100 on the basis of the output signal of the trigger multiplexer 114. That is, suppose that the synchronization multiplexer 116 outputs by selecting (further delaying by one clock cycle in the synchronization multiplexer 116) an output signal of the sixth stage flip-flop of the plurality of stages of flip-flops of the delay signal generator 115 according to control of the external control PC (refer to (d) of FIG. 3).

In this case, the output signal of the trigger multiplexer 114 of the master FPGA 100 may be input to the slave FPGA 200 as the first external input trigger signal (refer to (f) of FIG. 3), and as shown in (e) of FIG. 3, since there is a line delay between the master FPGA 100 and the slave FPGA 200, the first external input trigger signal of the slave FPGA 200 may be a signal delaying the output trigger signal trig_2_out of the master FPGA 100 by one clock cycle.

Meanwhile, since the first external input trigger signal trig_0_in input to the slave FPGA 200 also passes through the two-stage flip-flops for preventing the meta-stable state, the first external input trigger signal trig_0_in may be delayed by two clock cycles, and since the first external input trigger signal trig_0_in is further delayed by one clock cycle by passing through the trigger multiplexer 114, the first external input trigger signal trig_0_in may be totally delayed by three clock cycles (refer to (g) of FIG. 3) compared to a waveform shown in (f) of FIG. 3. Consequently, the synchronization signal SYNC of the slave FPGA 200 in synchronization with the synchronization signal SYNC generated in the master FPGA 100 may be a delayed signal by three clock cycles compared to the output signal of the trigger multiplexer 114 of the slave FPGA 200, and the synchronization multiplexer 116 of the slave FPGA 200 may precisely maintain synchronization of the master FPGA 100 and the slave FPGA 200 by selecting and outputting the delayed signal (refer to (h) of FIG. 3).

According to the device for maintaining synchronization of the plurality of FPGAs, the synchronization of the plurality of FPGAs connected in various topology types, such as a star shape, a ring shape, a mesh shape, etc., can be easily and promptly maintained without necessarily including the external trigger signal generator.

As described above, although the device for maintaining synchronization of the plurality of FPGAs according to the exemplary embodiment of the present invention was described in detail, this is only an exemplary embodiment. It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

For example, the flip-flop for preventing the meta-stable state may be configured as one stage or three stages.

What is claimed is:

1. A device for maintaining synchronization of a plurality of field programmable gate arrays (FPGAs) included in each of the plurality of FPGAs, comprising:
    a trigger signal generator configured to generate an internal trigger signal itself;
    a trigger multiplexer configured to select one of the internal trigger signal generated by the trigger signal generator and a trigger signal input from the outside;
    a delay signal generator including a plurality of stages of flip-flops, each of the plurality of stages of flip-flops configured to delay the trigger signal by one clock cycle; and
    a synchronization multiplexer configured to select and output one of output signals of the plurality of stages of flip-flops of the delay signal generator.

2. The device for maintaining synchronization of a plurality of FPGAs of claim 1, further comprising a flip-flop configured to prevent a meta-stable state of the external trigger signal and connected to a previous stage of the trigger multiplexer.

3. The device for maintaining synchronization of a plurality of FPGAs of claim 2, wherein the flip-flop is a D flip-flop.

4. The device for maintaining synchronization of a plurality of FPGAs of claim 3, further comprising a control unit configured to control the trigger multiplexer and the synchronization multiplexer, and control a pulse width and a period of the internal trigger signal output from the trigger signal generator.

* * * * *